(12) United States Patent
Chen et al.

(10) Patent No.: US 10,651,208 B2
(45) Date of Patent: *May 12, 2020

(54) DISPLAY DEVICE WITH DIFFERENT CIRCUIT GROUPS

(71) Applicant: InnoLux Corporation, Miao-Li County (TW)

(72) Inventors: Pei-Chieh Chen, Miao-Li County (TW); Hung-Kun Chen, Miao-Li County (TW); Tsung-Yu Wang, Miao-Li County (TW); Ying-Tong Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/237,864

(22) Filed: Jan. 2, 2019

(65) Prior Publication Data

US 2019/0139990 A1 May 9, 2019

Related U.S. Application Data

(63) Continuation of application No. 15/254,102, filed on Sep. 1, 2016, now Pat. No. 10,199,398.

(30) Foreign Application Priority Data

Oct. 16, 2015 (TW) .............................. 104133975 A (51) Int. Cl.
*H01L 27/12* (2006.01)
*H01L 27/02* (2006.01)
(Continued)

(52) U.S. Cl.
CPC .......... *H01L 27/124* (2013.01); *G02F 1/1345* (2013.01); *G02F 1/13454* (2013.01);
(Continued)

(58) Field of Classification Search
CPC ............. H01L 27/0255; H01L 27/0266; H01L 27/0296; H01L 27/124
(Continued)

(56) References Cited

U.S. PATENT DOCUMENTS 8,045,121 B2   10/2011   Kang
8,363,191 B2 *  1/2013   Yoshida ................ G02F 1/1345
                                                345/206
(Continued)

FOREIGN PATENT DOCUMENTS

CN    101452126    6/2009
TW    I400785      7/2013

*Primary Examiner* — Matthew E Warren
(74) *Attorney, Agent, or Firm* — McClure, Qualey & Rodack, LLP (57) ABSTRACT

A display device that includes a substrate having a display region and an adjacent peripheral region is provided, including; a plurality of sub-pixels provided within the display region; a plurality of data lines electrically connected to the sub-pixels; and a first electronic circuit group and a second electronic circuit group provided in the peripheral region, connected to the corresponding data lines. The first electronic circuit group includes a plurality of first electronic circuits, and the second electronic circuit group includes a plurality of second electronic circuits. Two adjacent first electronic circuits are arranged with a first interval therebetween, and the first interval has a first width. Two adjacent second electronic circuits are arranged with a second interval therebetween, and the second interval has a second width. The first width and the second width are different.

20 Claims, 6 Drawing Sheets

(51) Int. Cl.
*G02F 1/1345* (2006.01)
*G02F 1/1362* (2006.01)

(52) U.S. Cl.
CPC .... *G02F 1/136204* (2013.01); *H01L 27/0255* (2013.01); *H01L 27/0266* (2013.01); *H01L 27/0296* (2013.01); *G02F 2201/56* (2013.01)

(58) Field of Classification Search
USPC .............................................. 257/59, 72, 88
See application file for complete search history.

(56) References Cited

U.S. PATENT DOCUMENTS

| | | |
|---|---|---|
| 2009/0115933 A1 | 5/2009 | Mimura |
| 2013/0328840 A1 | 12/2013 | Fujikawa |
| 2015/0022770 A1 | 1/2015 | Yamaguchi et al. |
| 2016/0225787 A1 | 8/2016 | Katsuta et al. |
| 2017/0062408 A1 | 3/2017 | Chung |

* cited by examiner

DISPLAY DEVICE WITH DIFFERENT CIRCUIT GROUPS

CROSS REFERENCE TO RELATED APPLICATIONS

This Application is a Continuation application of U.S. application Ser. No. 15/254,102, filed on Sep. 1, 2016, now U.S. Pat. No. 10,199,398, which claims priority of Taiwan Patent Application No. 104133975, filed on Oct. 16, 2015, the entirety of which are incorporated by reference herein.

BACKGROUND OF THE INVENTION

Field of the Invention

The disclosure relates to a display device, and in particular it relates to a display device to optimize the design of the layout (i.e. the arrangement) of peripheral circuits.

Description of the Related Art

Display devices, such as liquid-crystal display devices, organic light-emitting diode display devices, electroluminescent display devices, and field-emission display devices, have found widespread application in a variety of electronic devices, due to their advantages which include being light, thin, and compact in size. A display device usually has a rectangular pixel region, but it may have a non-rectangular pixel region to match the electronic device on which the display device is installed.

To prevent electrostatic discharge (ESD) damaging pixel units and other circuits of a display device, electronic circuits such as ESD protection circuits are provided in a peripheral region of the display device, for improving ESD robustness. However, various wirings are provided in the peripheral region of the display device, and thus affecting layout and function of the ESD protection circuits.

BRIEF SUMMARY OF THE INVENTION

Accordingly, the disclosure provides a display device to optimize arrangement and layout of peripheral electronic circuits to improve ESD robustness.

According to one aspect of the disclosure, a display device comprises a substrate, a plurality of sub-pixels, a plurality of data lines, a first electronic circuit group, and a second electronic circuit group. The substrate has a display region and an adjacent peripheral region. The plurality of sub-pixels are arranged within the display region. The plurality of data lines are electrically connected to the sub-pixels. The first electronic circuit group comprises a plurality of first electronic circuits, which are arranged within the peripheral region and are electrically connected to a first portion of the data lines. The second electronic circuit group comprises a plurality of second electronic circuits, which are arranged within the peripheral region and are electrically connected to a second portion of the data lines. Two adjacent first electronic circuits are separated by a first interval, the first interval has a first width, two adjacent second electronic circuits are separated by a second interval, and the second interval has a second width. The first width and the second width are different.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

Hereinafter, the exemplary embodiments of the disclosure will be described in detail in reference to the accompanying drawings. Moreover, drawings are shown by emphasizing respective portions for easy understanding, and it should be noted that the dimensions thereof are not identical to those of practical circuits.

Figure 1:
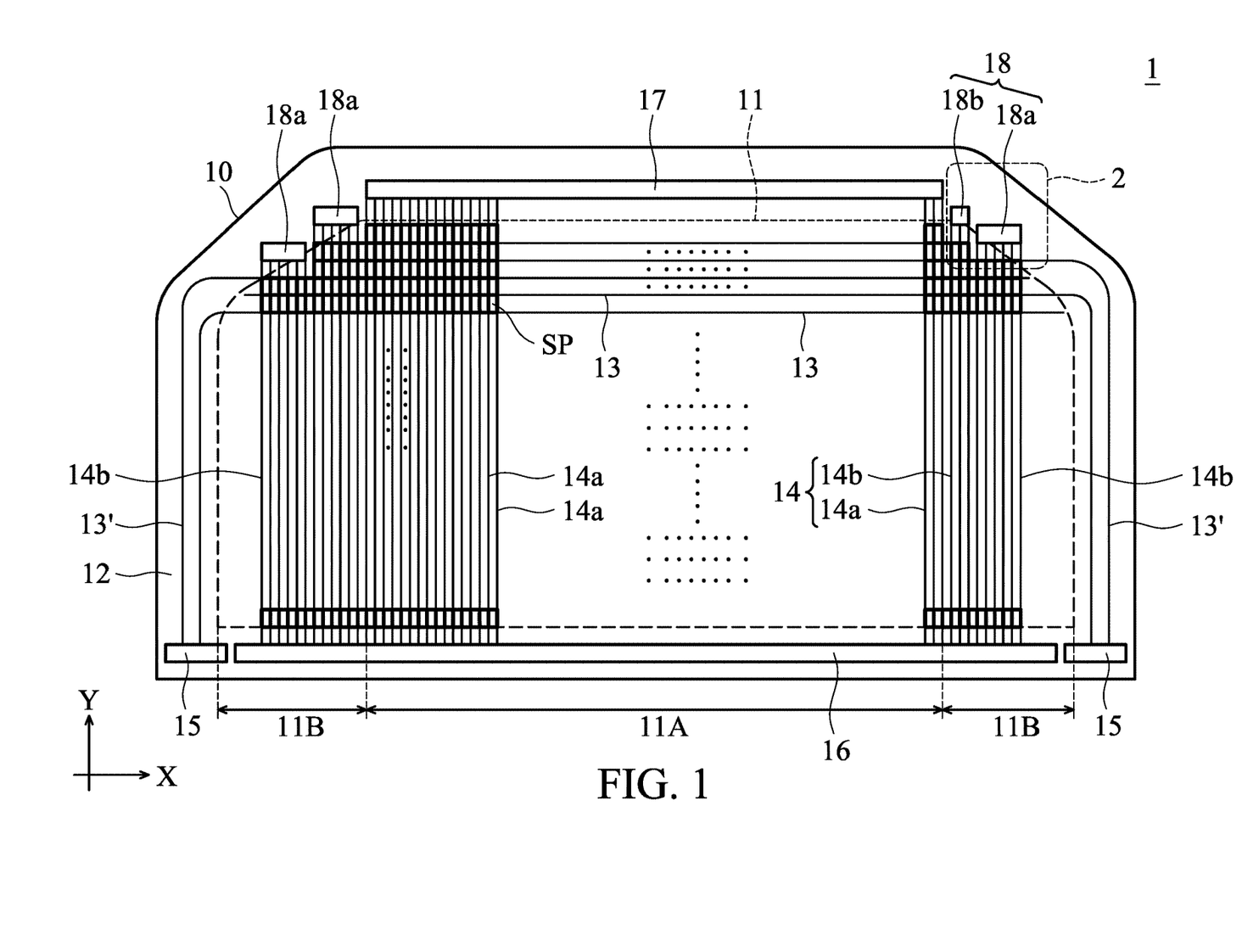
FIG. 1 shows a schematic diagram of an exemplary embodiment of a display device according to the disclosure.

FIG. 1 shows a schematic circuit diagram of a non-rectangular display device 1. The non-rectangular display device 1 comprises a substrate 10, a non-rectangular display region 11 and a peripheral region 12, both provided on the substrate 10, wherein the non-rectangular display region 12 has a plurality of sub-pixels SP. The substrate 10 may be a shape of rectangular, circular, elliptic, square, polygonal or irregular, which may further have lead angles at the corner. The substrate 10 may be made of glass, silicon, plastic or polymer. The non-rectangular display region 11 has a first region 11A and at least one second region 11B. The sub-pixels SP within the first region 11A are arranged in a rectangular pixel array as the common design for the general display device. For example, a rectangular pixel array of M rows and N columns is provided in the first region 11A, and the edges of the pixel array, respectively extending along the X and Y directions, are mutually orthogonal, where M and N are positive integers. For non-rectangular design, the sub-pixels SP within the second region 11B are arranged in a non-rectangular pixel array. In this embodiment, the non-rectangular display region 11 may have a first region 11A and two second regions 11B, but is not limited thereto. In some embodiments, the non-rectangular display region 11 may have at least one first region 11A and at least one second region 11B, but is not limited thereto. The peripheral region 12 is adjacent to and surrounds the non-rectangular display region 11. Circuit arrangements or layouts such as drive circuits for driving the sub-pixels SP within the non-rectangular display region 11, connection lines, test circuits or protection circuits are provided in the peripheral region 12. As the design of display devices is trending towards narrow frames, the available area of the peripheral region is reduced, thus limiting design flexibility with regard to the arrangement of circuits in the peripheral region.

The non-rectangular display region 11 has a plurality of scan lines 13 disposed along the X direction and a plurality of data lines 14 disposed along the Y direction. The scan lines 13 are orthogonal to the data lines 14 and the sub-pixels SP are respectively provided in the intersections of the scan lines 13 and the data lines 14. The data lines 14 have first data lines 14a disposed at the first region 11A and second data lines 14b disposed at the second regions 11B. In this embodiment, the lengths of the first data lines 14a are longer than those of the second data lines 14b and the amount of sub-pixels SP connecting the first data lines 14a is greater than those connecting the second data lines 14b. The subpixel SP has at least one switch and at least one pixel electrode. The switch may be a thin film transistor whose active layer may be made of amorphous silicon, poly-silicon or indium gallium zinc oxide (IGZO). The scan lines 13 and the data lines 14 may have a single layer or multiple layers made of copper (Cu), aluminum (Al), magnesium (Mg), molybdenum (Mo), titanium (Ti), chromium (Cr), manganese (Mn) and/or silver (Ag). The pixel electrode includes Indium Tin Oxide (ITO), and/or indium zinc oxide (TZO).

Referring to FIG. 1, two gate drive units 15 and a data drive unit 16 are provided in the peripheral region 12, electrically connected to the scan lines 13 and the data lines 14. In this embodiment, the gate drive units 15 and the data drive unit 16 are disposed on the same side of the peripheral region 11. In some embodiments, the gate drive units 15 and the data drive unit 16 may be disposed on the different sides of the peripheral region 11. In this embodiment, two gate drive units 15 are provided at two sides of the peripheral region 12, respectively connecting the odd scan lines and even scan lines of the scan lines 13 through scan connection lines 13' for applying gate scan signals to turn on the sub-pixels SP. In some embodiments, one gate drive unit 15 may be provided at the peripheral region 12, connecting the scan lines 13 through scan connection lines 13'. The data drive unit 16 respectively connects the data lines 14 for applying data signals to the pixel electrodes in the sub-pixels SP.

At least one first electronic circuit group 17 and at least one second electronic circuit group 18 are provided at the peripheral region 12. The first electronic circuit group 17 is electrically connected to terminals of the first data lines 14a in the first region 11A and the second electronic circuit group 18 is electrically connected to terminals of the second data lines 14b in the second region 11B. In this embodiment, the display circuit 1 has a first electronic circuit group 17 and a second electronic circuit group 18. The second electronic circuit group 18 has at least one first-type group 18a and at least one second-type group 18b. The first electronic circuit group 17 connecting more data lines 14 has more electronic circuits therein and occupies more area than the second electronic circuit group 18. The first-type group 18a has more electronic circuits, connects more data lines 14 and occupies more area than the second-type group 18b. In some embodiments, the display device 1 may comprise several first electronic circuit groups 17 which have more electronic circuits, connects more data lines 14 and occupies more area than the first-type group 18a and the second-type group 18b.

Figure 2:
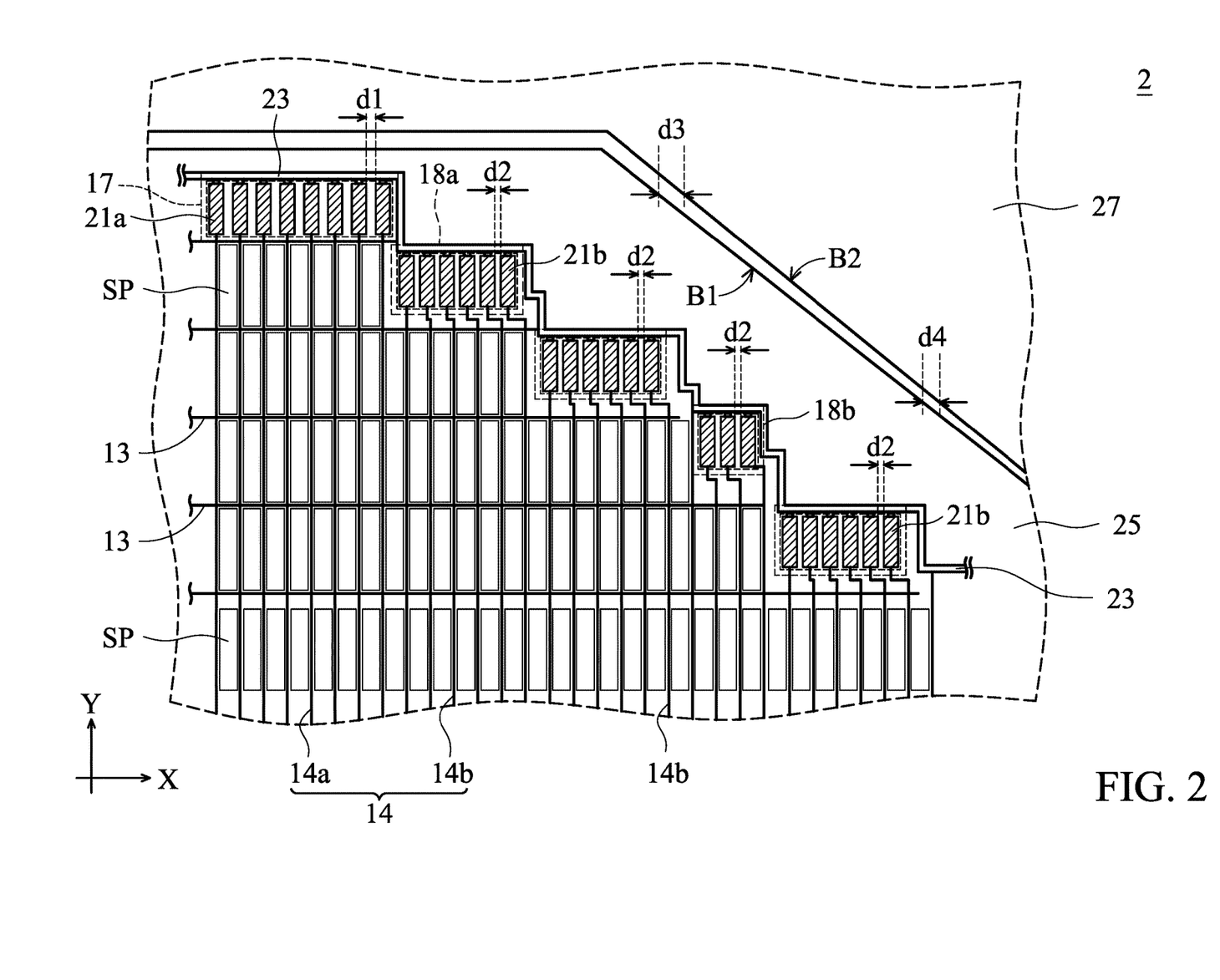
FIG. 2 shows a partial circuit diagram corresponding to the display device in FIG. 1.

FIG. 2 shows a partial circuit diagram 2 corresponding to the display device 1 in FIG. 1. In FIG. 2, the first electronic circuit group 17 comprises a plurality of first electronic circuit 21a respectively and electrically connecting to terminals of the data lines 14a. The second electronic circuit group 18 comprises a plurality of second electronic circuits 21b respectively and electrically connecting to terminals of the data lines 14b, arranged along the extension direction (X direction) of the scan lines 13. In this embodiment, the first-type group 18a has six second electronic circuits 21b and the second-type group 18b has three second electronic circuits 21b. In some embodiments, the numbers of the second electronic circuits 21b in the first-type group 18a and the second-type group 18b are integers, depending on the sub-pixels SP and the second data lines 14b. Along the Y direction (the extension direction of the data lines 14, 14a, 14b), an interval is between the first electronic circuit group 17 (the first electronic circuits 21a arranged in row) and the second electronic circuit 21b arranged in row. That is, the first electronic circuits 21a and the second electronic circuit 21b do not overlap in either the X or Y direction. Also, the first-type group 18a and the second-type group 18b do not overlap in either the X or Y direction.

In the above examples, the first and second electronic circuits 21a and 21b are electrostatic discharge (ESD) protection circuits. For example, the ESD protection circuit may comprise two diodes which made by thin film transistors, and the two diodes connected in an inverse parallel connection, but it is not limited thereto.

Two adjacent first electronic circuits 21a in the first electronic circuit group 17, along the X direction, have a first interval therebetween, and the first interval has a first width d1. Two adjacent second electronic circuits 21b in the second electronic circuit group 18, along the X direction, have a second interval therebetween, and the second interval has a second width d2. The first width d1 is not equal to the second width d2 (the first width d1 and the second width d2 are different). In this embodiment, the first width d1 is greater than the second width d2. The first width d1 is the distance between two edges of the two adjacent first electronic circuits 21a and the second width d2 is the distance between two edges of the two adjacent second electronic circuits 21b, as depicted in FIG. 2.

In FIG. 2, the peripheral region 12 further comprises a common line 23, a wiring layer 25 and a metal layer 27. The wiring layer 25 may comprise test lines or other signal connection lines, but it is not limited thereto. The metal layer 27 may be a common plane or a ground plane, but it is not limited thereto. As shown in FIG. 2, a portion of the wiring layer 25 has a first boundary B1 and a portion of the metal layer 27 has a second boundary B2. In the X direction, at least a third interval and a fourth interval are between the first boundary B1 and the second boundary B2. The third interval has a third width d3 and the fourth interval has a fourth width d4, and the third width d3 is not equal to the fourth width d4 (the third width d3 and the fourth width d4 are different). In this embodiment, the third width d3 is greater than the fourth width d4.

Figure 3:
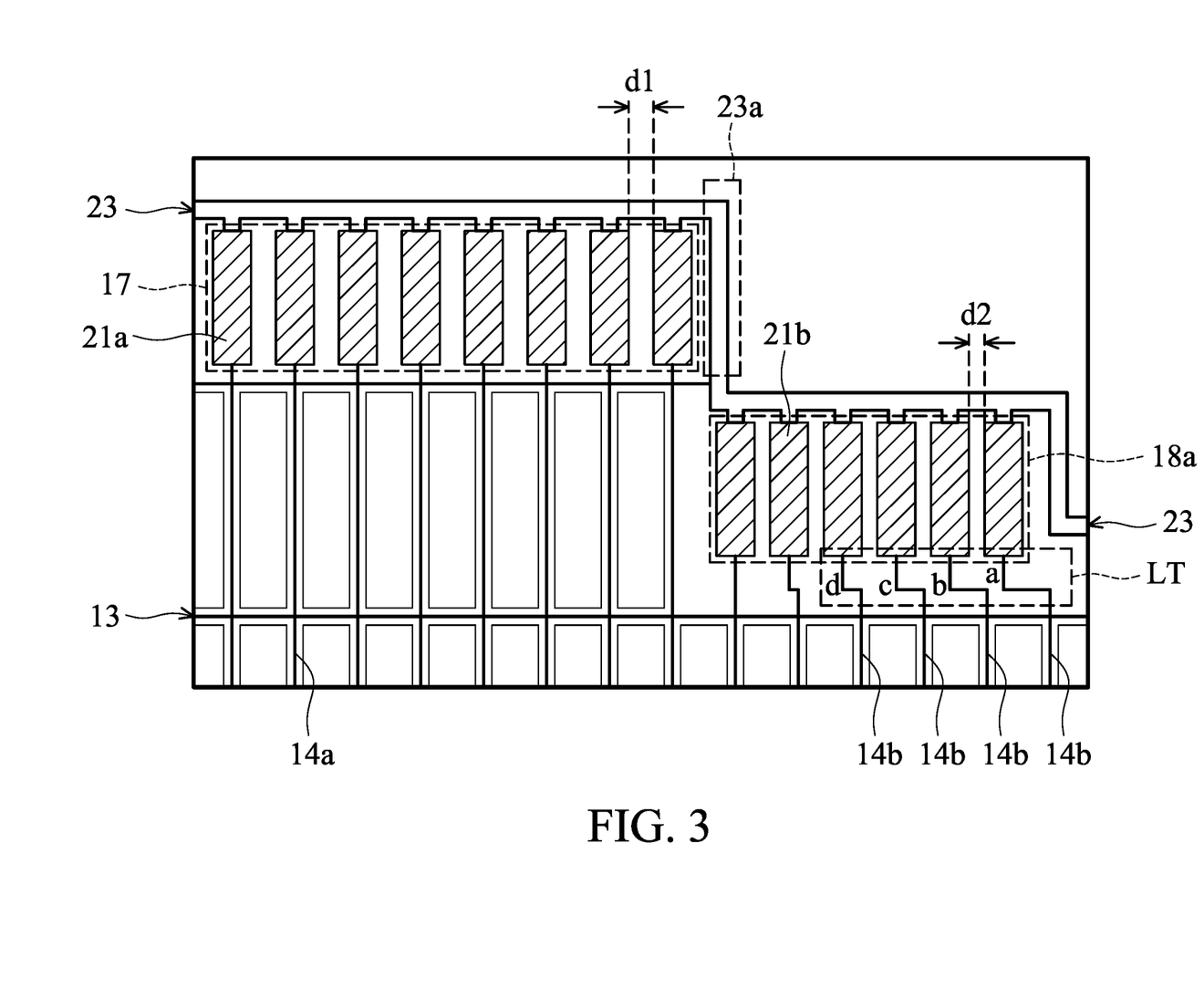
FIG. 3 shows a partial enlarged diagram of the region close to a first electronic circuit group 17 and a second electronic circuit group 18 in FIG. 2.

FIG. 3 shows a partial enlarged diagram of the region close to the first electronic circuit group 17 and a second electronic circuit group 18 in FIG. 2. All electronic circuits 21 (21a, 21b) are connected to the common line 23. In FIG. 3, the common line 23 has a first bending portion 23a and the first electronic circuit group 17 and the second electronic circuit 18 (the first-type group 18a) are connected by virtue of the first bending portion 23a.

Moreover in FIG. 3, the second electronic circuits 21b of the display device 1 are electrically connected to the corresponding second data lines 14b by virtue of a connection portion LT. The connection portion LT comprises at least a straight line or a bending line. For example, four of the second electronic circuits 21b at the right side of the first-type group 18a are respectively connected to the corresponding data lines 14b through the bending lines a~d in the connection portion LT. It should be noted that the longer the distance between the bending line and the first bending portion 23a, the longer the bending line is (i.e., a>b>c>d).

Referring to FIGS. 1 to 3, regarding the peripheral region 12 corresponding to the second region 11B of the non-rectangular display region 11, the common line 23, the wiring layer 25 and the metal layer 27 have taken a certain layout area after impedance consideration, and thus a limited, small area is reserved for the electronic circuits 21. Therefore, one feature of the disclosure is setting the second width d2 of the second interval which is between adjacent second electronic circuits 21b is less than the first width d1 of the first interval which is between adjacent first electronic circuits 21a. For responding to the reduction width of the interval (from the first width d1 to the second width d2), the connection portion LT (such as bending lines a~d) is provided to connect the electronic circuit 21, for example the second electronic circuit 21b in the second electronic circuit group 18b, to the corresponding second data lines 14b. In view of the above features, the design of the layout is optimized and more flexible.

Figure 4A:
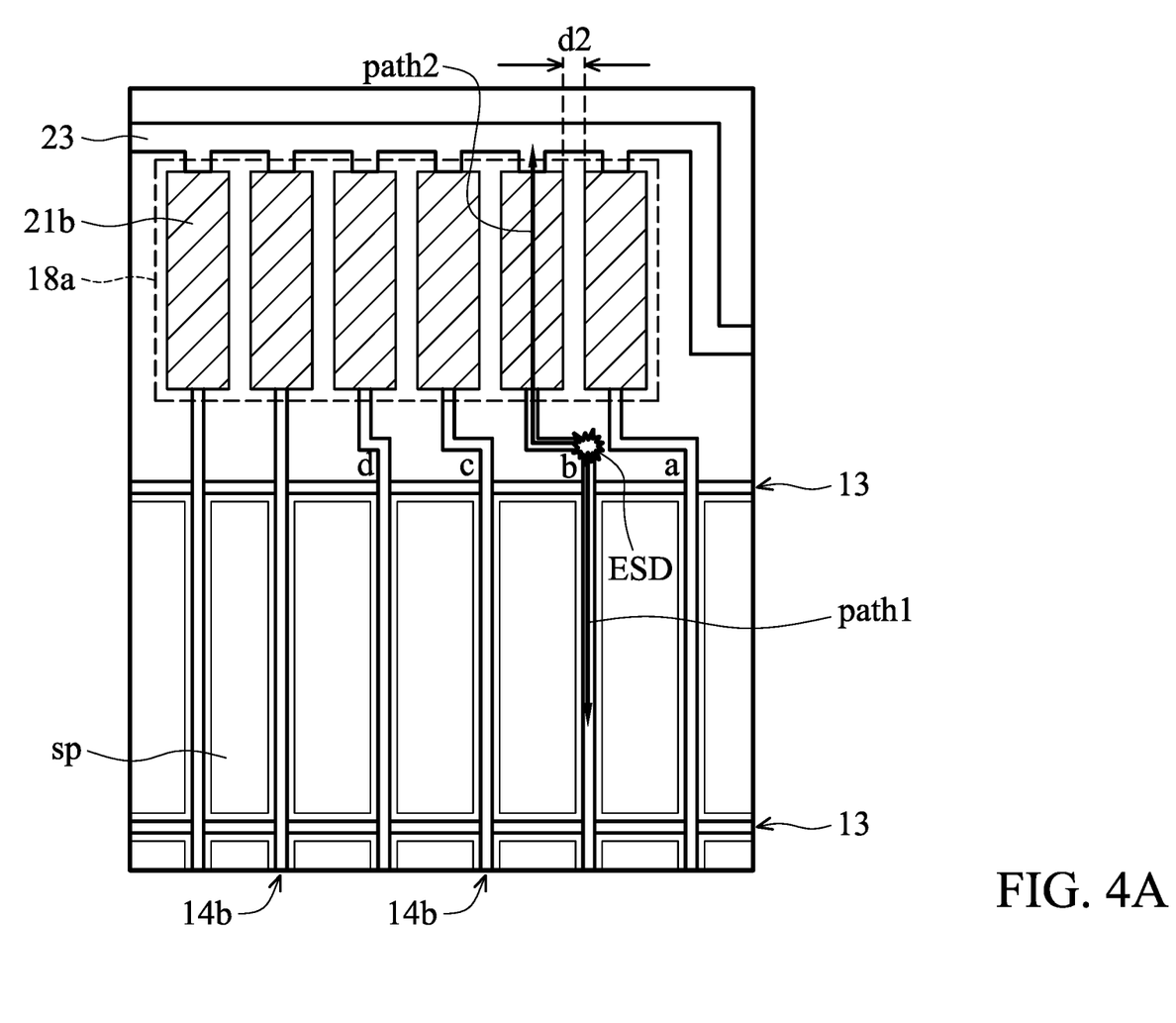
FIGS. 4A and 4B show partial enlarged diagrams of the region close to the second electronic circuit group 18 in FIG. 3.
Figure 4B:
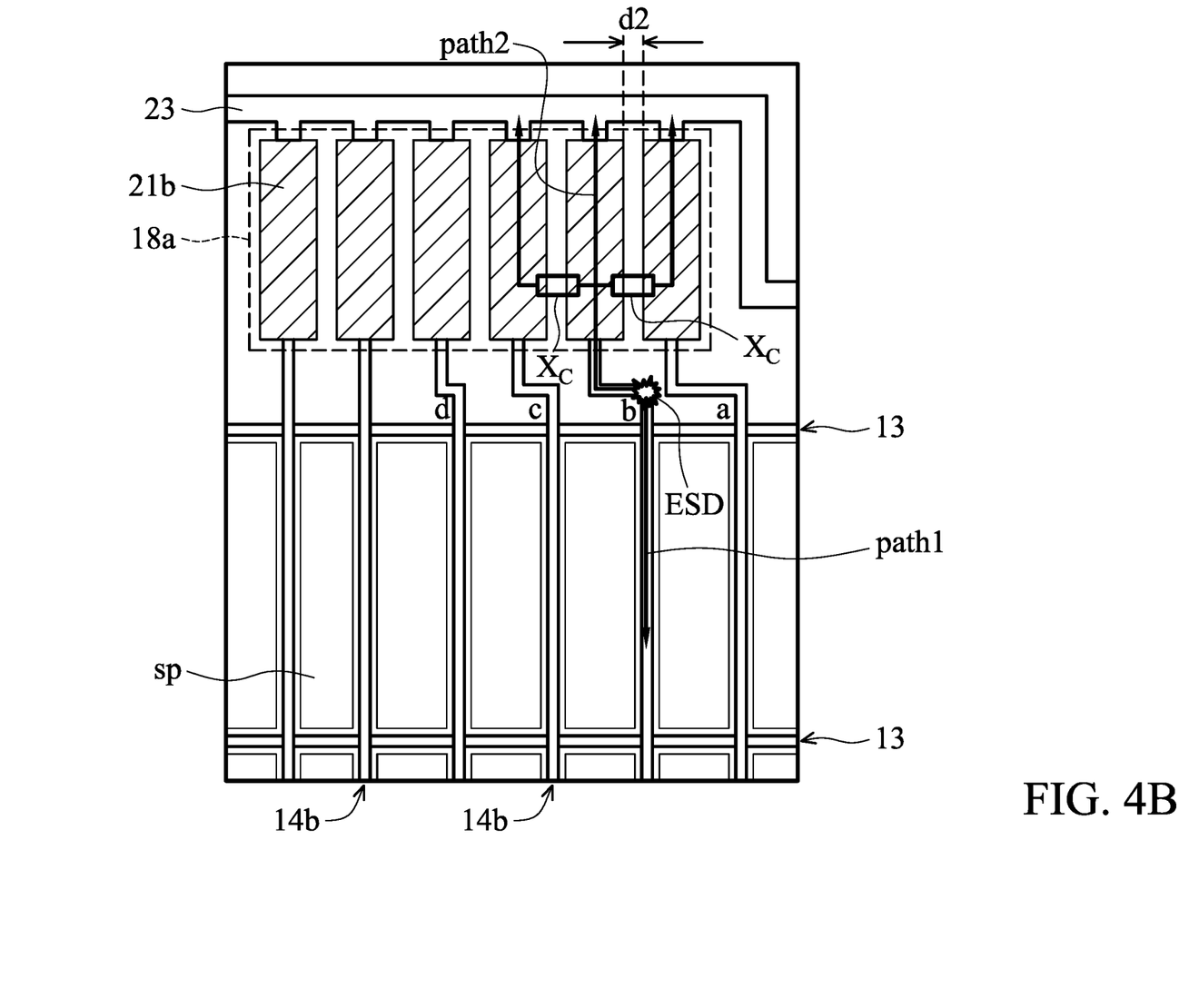

FIGS. 4A and 4B show a partial enlarged diagram of the region close to the second electronic circuit group 18 in FIG. 3, to describe the electrical performance of the arrangements of the electronic circuits 21 in an ESD event.

Referring to FIG. 4A, when an ESD event occurs at the bending line b, the ESD current may flow through a first path path1 and a second path path2, if most of the ESD current flows through the first path path1, it may damage the internal circuit of the sub-pixel SP which connects the data line 14b in the second region 11B of the non-rectangular display region 11 (FIG. 1), wherein for example the internal circuit may be a thin-film transistor or another display unit. Because the second width d2 of the second interval which is between two adjacent electronic circuits 21b in the first-type and second-type groups 18a, 18b is less than the first width d1 of the first interval, the capacitance Xc (FIG. 4B) between the two adjacent electronic circuits 21b increases and thus enhances the electrical coupling capability. For the high-frequency alternating-current ESD current, enhancing electrical coupling capability is equivalent to increasing the width of the second path path2 (FIG. 4B). Therefore, most of the ESD current is easily bypassed to the second path path2 due to the bouncing capability of the ESD current (FIG. 4B), thereby reducing the ESD current flowing through the first path path1.

Figure 5:
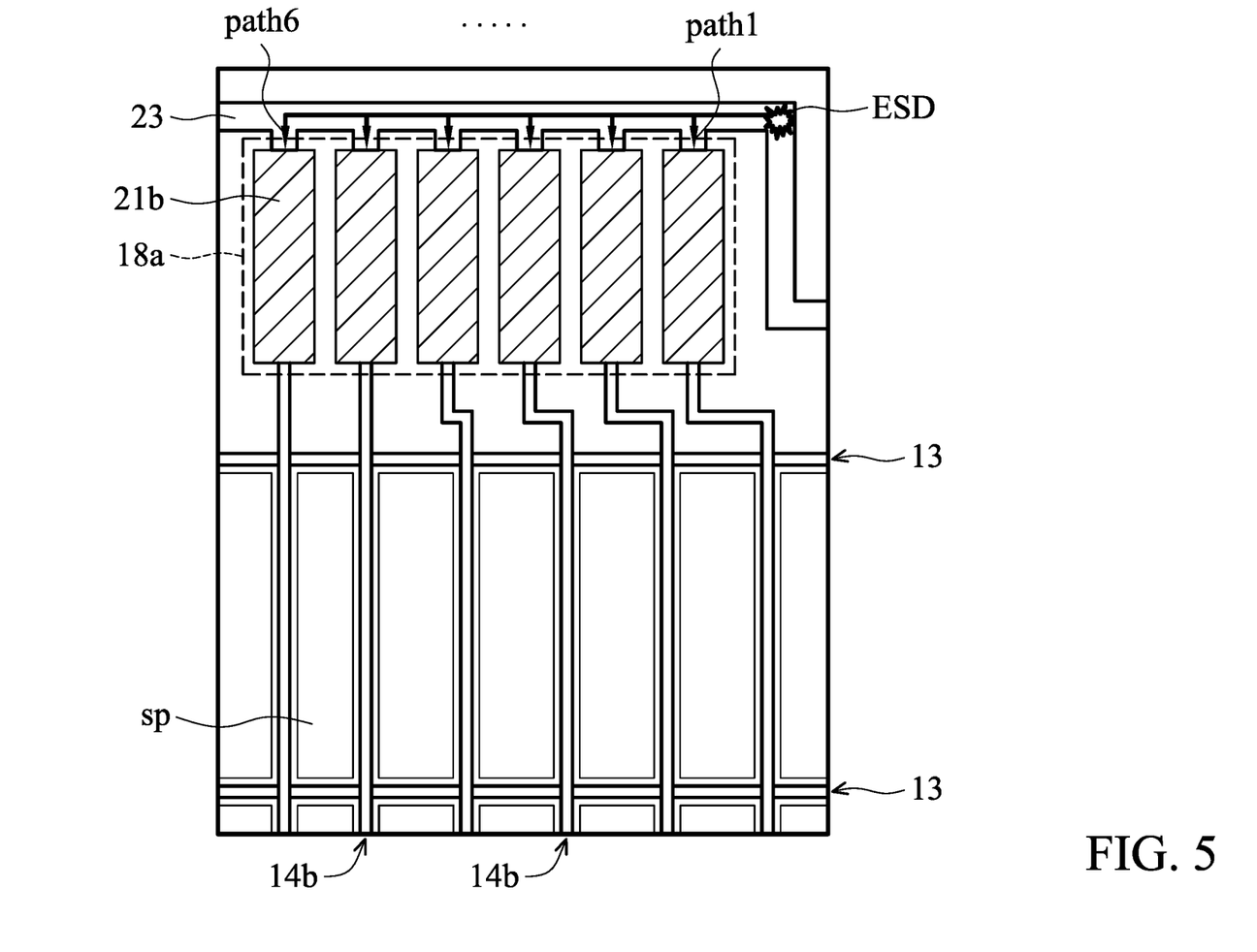
FIG. 5 shows a partial enlarged diagram of the region close to the second electronic circuit group 18 in FIG. 3.

FIG. 5 shows a partial enlarged diagram of the region close to the second electronic circuit group 18 in FIG. 3 to describe the electricity performance of the arrangements of the electronic circuits 21 in an ESD event.

Referring to FIG. 5, an ESD event occurring outside the display region 11, for example at the first bending portion of the common line 23, is considered. The equivalent impedance of a discharge path is directly proportional to its length and the ESD current flowing through the discharge path is inversely proportional to the impedance. Therefore, if the length differences among the paths path1~path6 are large, the distribution differences of discharge current to the respective paths path1~path6 become large. For example, if most of discharge current flows into the path path1, the discharge current makes the electronic circuit 21b (such as a diode) break down and turn on, further damaging the internal circuit of the sub-pixel which connects the data line 14b in the second region 11B of the non-rectangular display region 11 (FIG. 1), wherein for example the internal circuit may be a thin film transistor or another display unit. Therefore, the second width d2 of the second interval which is between two adjacent electronic circuits 21b in the first-type and second-type groups 18a, 18b is set to be less than the first interval d1 of the first interval, such that two adjacent second electronic circuits 21b in the second electronic circuit group 18 are closer to each other for distributing the discharge current as uniformly as possible to the paths path1~path6 and reducing the possibility of damage.

While the disclosure has been described by virtue of examples and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
   a substrate having a non-rectangular display region and a peripheral region which are adjacent to each other, wherein the non-rectangular display region comprises a first region and a second region;
   a plurality of first sub-pixels arranged in a rectangular pixel array within the first region;
   a plurality of second sub-pixels arranged in a non-rectangular pixel array within the second region;
   a plurality of first data lines disposed at the first region;
   a plurality of second data lines disposed at the second region;
   a plurality of first electronic circuits disposed at the peripheral region; and
   a plurality of second electronic circuits disposed at the peripheral region,
   wherein one of the plurality of first data lines in the first region is longer than one of the plurality of second data lines in the second region,
   wherein the plurality of first electronic circuits are electrically connecting to the plurality of first data lines and the plurality of second electronic circuits are electrically connecting to the plurality of second data lines.

2. The display device as claimed in claim 1, wherein a number of the first sub-pixels is greater than a number of the second sub-pixels.

3. The display device as claimed in claim 1, wherein an area of the first region is larger than an area of the second region.

4. The display device as claimed in claim 1, further comprising:
   a gate drive unit and a data drive unit, wherein the gate drive unit and the data drive unit are disposed on the same side of the first region.

5. The display device as claimed in claim 1, further comprising:
   a gate drive unit and a data drive unit, wherein the gate drive unit and the data drive unit are disposed on the different sides of the first region.

6. The display device as claimed in claim 1, further comprising:
   a gate drive unit and a data drive unit, disposed on the same side of the second region.

7. The display device as claimed in claim 1, further comprising:
   a first bending line, connected to one of the plurality of second data lines and the first bending line provided in the peripheral region.

8. The display device as claimed in claim 7, further comprising:
   a second bending line, connected to one of the plurality of second data lines and the second bending line provided in the peripheral region.

9. The display device as claimed in claim 8, wherein the second bending line is farther away from the first region than the first bending line in an X direction.

10. The display device as claimed in claim 9, wherein a length of the second bending line is greater than a length of the first bending line.

11. The display device as claimed in claim 1, wherein a number of the first data lines is greater than a number of the second data lines.

12. The display device as claimed in claim 1, further comprising:
a common line, provided in the peripheral region.

13. The display device as claimed in claim 12, wherein the common line has a first bending portion, the first bending portion is between an extension line of one of the first data lines and an extension line of one of the second data lines.

14. A display device, comprising:
a substrate having a non-rectangular display region and a peripheral region which are adjacent to each other, wherein the non-rectangular display region comprises a first region and a second region;
a plurality of first sub-pixels arranged in a rectangular pixel array within the first region;
a plurality of second sub-pixels arranged in a non-rectangular pixel array within the second region;
a plurality of scan lines disposed at the non-rectangular display region;
a common line disposed at the peripheral region;
a plurality of first data lines disposed at the first region; and
a plurality of second data lines disposed at the second region,
wherein one of the plurality of first data lines in the first region is longer than one of the plurality of second data lines in the second region,
wherein one of the plurality of scan lines is the closest to a side of the substrate and a portion of the common line is between the one of the plurality of scan lines and the side of the substrate.

15. The display device as claimed in claim 14, wherein an area of the first region is larger than an area of the second region.

16. The display device as claimed in claim 14, further comprising:
a gate drive unit and a data drive unit, wherein the gate drive unit and the data drive unit are disposed on the same side of the first region.

17. The display device as claimed in claim 14, further comprising:
a plurality of first electronic circuits disposed at the peripheral region; and
a plurality of second electronic circuits disposed at the peripheral region,
wherein the plurality of first electronic circuits are electrically connecting to the plurality of first data lines and the plurality of second electronic circuits are electrically connecting to the plurality of second data lines.

18. The display device as claimed in claim 14, further comprising:
a first bending line, connected to one of the plurality of second data lines and the first bending line provided in the peripheral region; and
a second bending line, connected to one of the plurality of second data lines and the second bending line provided in the peripheral region,
wherein a length of the second bending line is greater than a length of the first bending line.

19. The display device as claimed in claim 14, wherein a number of the first data lines is greater than a number of the second data lines.

20. The display device as claimed in claim 14, wherein the common line has a first bending portion, the first bending portion is between an extension line of one of the first data lines and an extension line of one of the second data lines.

* * * * *